United States Patent
Matsumoto et al.

(10) Patent No.: US 6,809,577 B2
(45) Date of Patent: Oct. 26, 2004

(54) SEMICONDUCTOR INTEGRATED CIRCUIT HAVING INTERNAL POWER SUPPLY VOLTAGE DOWN CONVERSION CIRCUIT

(75) Inventors: Yasuhiro Matsumoto, Hyogo (JP); Kouji Tanaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/340,614

(22) Filed: Jan. 13, 2003

(65) Prior Publication Data

US 2004/0027171 A1 Feb. 12, 2004

(30) Foreign Application Priority Data

Aug. 8, 2002 (JP) ........................................ 2002-231514

(51) Int. Cl.$^7$ .............................. G05F 1/10; G05F 3/02
(52) U.S. Cl. ...................................... 327/541; 327/538
(58) Field of Search .................................. 327/538, 540, 327/541, 543; 323/280

(56) References Cited

U.S. PATENT DOCUMENTS

| | | | | |
|---|---|---|---|---|
| 5,373,477 A | * | 12/1994 | Sugibayashi | 365/226 |
| 5,812,021 A | * | 9/1998 | Ikeda | 327/541 |
| 6,469,573 B2 | * | 10/2002 | Kanda et al. | 327/541 |
| 6,509,787 B1 | * | 1/2003 | Kang | 327/541 |
| 2003/0098735 A1 | * | 5/2003 | Jaussi et al. | 327/530 |

* cited by examiner

Primary Examiner—Quan Tra
(74) Attorney, Agent, or Firm—McDermott Will & Emery LLP

(57) ABSTRACT

In an oscillation detection circuit an internal voltage is compared with an oscillation detection level corresponding to a reference voltage plus a predetermined variation and when a voltage having a level higher than the oscillation detection level is observed a predetermined number of times within a predetermined period of time a decision is made that the internal voltage is in oscillation and an oscillation detection signal having the high level is output. In the internal power supply voltage down conversion circuit when a p-channel MOS transistor receives the oscillation detection signal of the high level the transistor turns off to interrupt a current supplied from a drive transistor to an internal power supply node.

10 Claims, 7 Drawing Sheets

SEMICONDUCTOR INTEGRATED CIRCUIT HAVING INTERNAL POWER SUPPLY VOLTAGE DOWN CONVERSION CIRCUIT

BACKGROUND OF THE INVENTION

1. Field of the Invention

The present invention relates generally to semiconductor integrated circuits and particularly to those capable of detection and elimination of oscillation introduced in their internal voltage down conversion circuits.

2. Description of the Background Art

In recent years in LSI (Large Scale Integrated circuit) microfabrication insufficient breakdown voltages associated with transistors' gate oxide film reduced in thickness are complemented by providing a voltage down conversion circuit in semiconductor integrated circuits to down-convert external power supply voltage. The down-converted power supply is used as an operating voltage to ensure reliability.

Generally it is desirable that the down-converted power supply be able to supply a constant voltage however operating conditions may vary. Accordingly, a conventional, internal power supply voltage down conversion circuit generates a constant reference voltage impervious to a variety of external power supply and fabrication process variations and in accordance the reference voltage generates a down converted voltage. This configuration is shown in FIG. 10, as standardized.

FIG. 10 is a circuit diagram specifically showing one example of the conventional, internal power supply voltage down conversion circuit.

As shown in FIG. 10, the conventional internal power supply voltage down conversion circuit includes a comparator detecting a difference in potential between the level of an internal voltage and the reference voltage and outputting a result of the comparison as a power supply drive signal DRV, and a feedback loop driven by signal DRV to control a drive transistor 17 formed by a p-channel MOS (Metal Oxide Semiconductor) transistor.

The comparator is a current mirror differential amplifier formed of n-channel MOS transistors 16 and 15 having their respective gates receiving internal voltage VDL and reference voltage VREF, respectively, with p-channel MOS transistors 13 and 14, having their sources connected to an external power supply node 6, as a load.

P-channel MOS transistors 13 and 14 configure a current mirror circuit, the former's gate connected to the latter's gate and drain.

Transistor 15 has its drain connected to that of transistor 13 and its source grounded.

Transistor 16 has its drain connected to the drain and gate of transistor 14 and the gate of transistor 13, its gate connected to an internal power supply node 2 and its source grounded.

The comparator has an output node, or the drain of transistor 15, connected to the gate of drive transistor 17.

Drive transistor 17 has its source connected to external power supply node 6, its gate to the comparator's output node or the transistor 15 drain, and its drain connected to internal power supply node 2.

When drive transistor 17 receives at its gate the power supply drive signal DRV output from the comparator, drive transistor 17 accordingly supplies a current to internal power supply node 2 connected to its source.

If in this configuration a current is supplied to a load (not shown) connected to internal power supply node 2, drive transistor 17 acts as an impedance and the transistor's drain voltage, or internal voltage VDL, varies negatively. When internal voltage VDL starts to be lower than reference voltage VREF, the comparator outputs power supply drive signal DRV of the logical low level. Drive transistor 17 receiving signal DRV of the low level at its gate turns on and starts to charge internal power supply node 2 while supplying the load (not shown) with a current. When the node has been charged to a level and internal voltage VDL starts to be larger than reference voltage VREF, the comparator outputs power supply drive signal DRV having a logical high level. Drive transistor 17 having received signal DRV of the high level at its gate turns off and stops charging the node.

Thus the internal power supply voltage down conversion circuit eliminates variation in level of internal voltage VDL.

Furthermore a conventional, internal power supply voltage down conversion circuit prevents impaired low power characteristics in a standby state. To achieve this, when a large amount of power is consumed or in an active state a large current is synchronously passed to a load to eliminate variation in internal voltage VDL and when a small amount of current is consumed or in a standby state a current that is supplied is minimized to allow the internal power supply voltage down conversion circuit to be of small power.

Thus the conventional, internal power supply voltage down conversion circuit having an ability to supply a current that alters in the standby or active state of the semiconductor integrated circuit can eliminate variation in internal voltage VDL between modes of operation accompanied by different amounts of power consumption.

However, the current supplying ability in each mode is maintained to be constant throughout the mode.

FIG. 11 is a diagram representing a waveform of internal voltage VDL in the conventional, internal power supply voltage down conversion circuit.

As represented in FIG. 11, internal voltage VDL in a normal operation state maintains a constant level in voltage with reference to reference voltage VREF. If power consumption is large and the current supplying ability is excessively increased, however, internal voltage VDL oscillates, having a large variation relative to reference voltage VREF, and this may result in the semiconductor integrated circuit being unable to operate normally.

However, the conventional, internal power supply voltage down conversion circuit provides the current supplying ability that is maintained to be constant throughout each of the active and standby state. As such, if internal voltage VDL oscillates, the current supplying ability does not vary and the oscillation continues disadvantageously.

Furthermore, in estimating a semiconductor integrated circuit including a conventional, internal power supply voltage down conversion circuit, whether internal voltage is in oscillation or not cannot be determined by means other than directly monitoring the level of the internal voltage for example via a tester. As such if the tester for example has an insufficient capacity it can fail to detect that the internal voltage is in oscillation.

SUMMARY OF THE INVENTION

One object of the present invention is therefore to ensure detection of an oscillation introduced by a current excessively supplied in an internal power supply voltage down conversion circuit.

Another object of the present invention is to provide a semiconductor integrated circuit capable of reducing a current supplying ability to spontaneously eliminate an oscillation detected in the internal power supply voltage down conversion circuit.

In accordance with present invention in one aspect a semiconductor integrated circuit operates receiving at an internal circuit an internal voltage from an internal power supply node, the internal voltage being lower than an external power supply voltage, and it includes: an internal power supply voltage down conversion circuit generating the internal voltage at the internal power supply node, the internal voltage being the external power supply voltage decreased to a reference voltage corresponding to a targeted level; and an oscillation detection circuit outputting an oscillation detection signal when a variation of no less than a predetermined variation is observed in the internal voltage relative to the reference voltage a predetermined number of times within a predetermined period of time.

In accordance with the present invention in another aspect when the internal power supply voltage down conversion circuit receives the oscillation detection signal from the oscillation detection circuit the internal power supply voltage down conversion circuit reduces an ability to supply a current to the internal power supply node.

In accordance with the present invention in still another aspect the oscillation detection circuit inactivates the shaped oscillation signal after the oscillation detection signal is output when a predetermined period of time elapses. An internal power supply voltage down conversion circuit includes a comparison circuit comparing an internal voltage with a reference voltage and outputting a signal corresponding to a result of the comparison, a drive transistor operative in response to the signal from the comparison circuit to supply an internal power supply node with a current to generate an internal voltage, and a first field effect transistor operative in response to the oscillation detection signal to electrically couple the drive transistor to the internal power supply node. When the oscillation detection signal inactivated is received the internal power supply voltage down conversion circuit turns on the first field effect transistor to resume supplying a current to the internal power supply node.

In accordance with the present invention in still another aspect the semiconductor integrated circuit further includes a test mode circuit receiving an oscillation detection signal from the oscillation detection circuit and outputting the oscillation detection signal to an external output node when the test mode circuit receives a test mode signal having a predetermined logical level.

Preferably the semiconductor integrated circuit further includes a test mode circuit receiving an oscillation detection signal from the oscillation detection circuit and outputting the oscillation detection signal to the internal power supply voltage down conversion circuit when the test mode circuit receives a test mode signal having a predetermined logical level. When the internal power supply voltage down conversion circuit receives the oscillation detection signal from the test mode circuit the internal power supply voltage down conversion circuit interrupts a current supplied to the internal power supply node and electrically shorts the internal power supply node.

Thus in accordance with the present invention in one aspect an oscillation detection circuit constantly compares an internal voltage level with an oscillation detection level set to be higher in potential than a reference voltage and when the internal voltage level has exceeded the oscillation detection level a predetermined number of times within a predetermined period an oscillation detection signal can be output to allow more ensured oscillation detection than when for example a tester is used to monitor the internal voltage.

Note that the oscillation detection level that is set to be higher in potential than the reference voltage can prevent erroneous detection as an oscillation of a variation in the internal voltage that is attributed to a factor other than oscillation such as noise.

Furthermore, the oscillation detection signal that is delayed and input as a counter reset signal can prevent erroneous detection for example of irregularly appearing noise.

Furthermore in accordance with the present invention in another aspect the oscillation detection signal that is fed back to the internal power supply voltage down conversion circuit can be used to reduce the down conversion circuit's current supplying ability to spontaneously eliminate an oscillation in the down conversion circuit.

Furthermore in the present invention in still another aspect in the internal power supply voltage down conversion circuit the oscillation detection signal fed back from the oscillation detection circuit can be used to provide a reduced current supplying ability to spontaneously eliminate an oscillation and furthermore after a predetermined period of time has elapsed the oscillation detection signal can be inactivated to increase the reduced current supplying ability to prevent the internal voltage from dropping in level.

Note that the period of time between elimination of oscillation and recovery of the current supplying ability can be set by a delay stage to be a sufficiently long period to prevent possible, subsequent oscillation.

Furthermore in accordance with the present invention in still another aspect in a test mode of operation the oscillation detection signal can be monitored at an external output node to allow more ensured oscillation detection than when an internal voltage's level is directly monitored.

Furthermore in accordance with the present invention in still another aspect in a test mode of operation an oscillation detection signal fed back to the internal power supply voltage down conversion circuit can be used to prevent a normal operation of a semiconductor integrated circuit to eliminate the necessity of monitoring any node to confirm an oscillation of an internal power supply.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
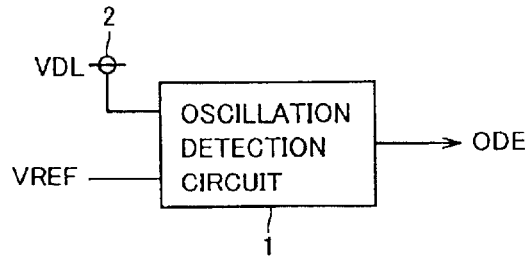
FIG. 1 is a functional block diagram functionally illustrating a portion extracted from a semiconductor integrated circuit of a first embodiment of the present invention that is involved in oscillation detection.

Hereinafter embodiments of the present invention will more specifically be described with reference to the drawings. In the figures, like reference characters denote like components.

First Embodiment

With reference to FIG. 1, an oscillation detection circuit 1 receives an internal voltage VDL generated at an internal power supply node 2 of an internal power supply voltage down conversion circuit (not shown) and a reference voltage VREF.

As will be described hereinafter, in oscillation detection circuit 1 a level in voltage corresponding to reference voltage VREF input plus a predetermined variation is set as an oscillation detection level.

Oscillation detection circuit 1 compares internal voltage VDL with this oscillation detection level and when a voltage higher in level than the oscillation detection level is observed a predetermined number of times for a predetermined period of time a decision is made that internal voltage VDL is in oscillation and oscillation detection circuit 1 outputs an oscillation detection signal ODE having the high level.

Figure 2:
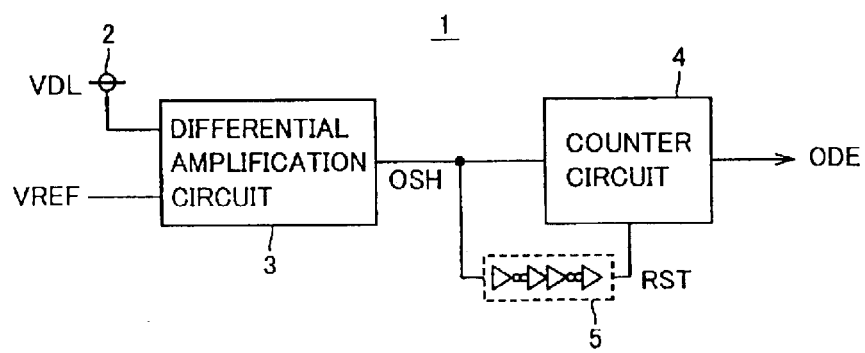
FIG. 2 is a functional block diagram functionally illustrating an oscillation detection circuit 1 in the semiconductor integrated circuit of the first embodiment of the present invention.

FIG. 2 is a functional block diagram specifically showing oscillation detection circuit 1 in the semiconductor integrated circuit of the first embodiment shown in FIG. 1.

As shown in FIG. 2, the FIG. 1 oscillation detection circuit 1 includes a differential amplification circuit 3 comparing internal voltage VDL with the oscillation detection level, a counter circuit 4 connected to an output node of differential amplification circuit 3, and a delay stage 5 configured of a plurality of inverters and receiving a signal from differential amplification circuit 3 for delaying the signal and outputting it to counter circuit 4.

In differential amplification circuit 3 a potential with a predetermined amount in variation added thereto based on reference voltage VREF input is set as an oscillation detection level. When internal voltage VDL and reference voltage VREF are input, internal voltage VDL and the oscillation detection level are compared in level in voltage and as a result of the comparison is output an shaped oscillation signal OSH varying between the two potentials of high and low levels.

Herein, shaped oscillation signal OSH is a signal which attains the high and low levels when internal voltage VDL is higher and lower, respectively, in potential than the oscillation detection level.

Shaped oscillation signal OSH output from differential amplification circuit 3 is received by counter circuit 4. Furthermore, delay stage 5 passes signal OSH, delaying the signal for a predetermined period predetermined by the number of inverters configuring delay stage 5, and outputs the delayed signal as a counter reset signal RST to counter circuit 4.

When counter circuit 4 receives shaped oscillation signal OSH, counter circuit 4 starts to count the high level appearing in signal OSH.

When a count value has reached a predetermined number of times, counter circuit 4 determines that internal voltage VDL is in oscillation and counter circuit 4 outputs oscillation detection signal ODE having the high level.

If the count value fails to reach the predetermined number of times within a predetermined period of time, then counter circuit 4 returns to its initial state, reset by counter reset signal RST delayed by delay stage 5 for a predetermined period of time and then input.

Note that the period in counter circuit 4 for oscillation detection is set to be a limited period of time so as to prevent erroneous detection of irregularly appearing noise or the like as oscillation.

Figure 3:
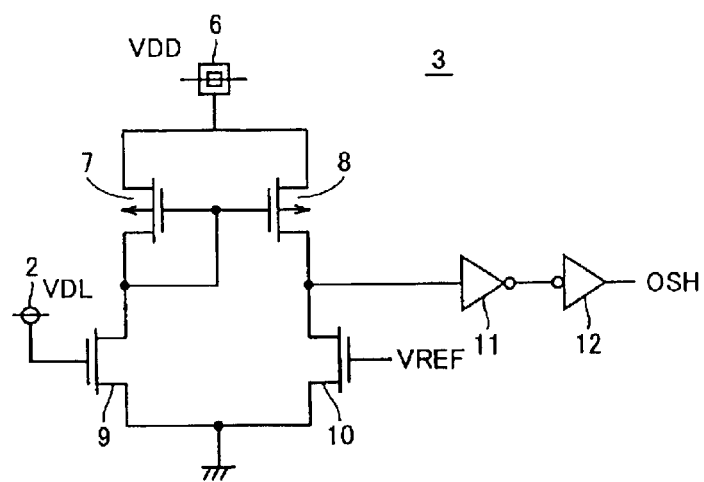
FIG. 3 is a circuit diagram specifically showing a differential amplification circuit 3 shown in FIG. 2.

FIG. 3 is a circuit diagram specifically showing one example of differential amplification circuit 3 of FIG. 2.

As shown in FIG. 3, differential amplification circuit 3 of FIG. 2 is formed of a current mirror differential amplifier formed of n-channel MOS transistors 9 and 10 with p-channel MOS transistors 7 and 8 serving as a load, and inverters 11 and 12 in two stages connected to the transistor 10 drain or an output node of the current mirror differential amplifier.

P-channel MOS transistors 7 and 8 have their sources connected to an external power supply node 6 and their drains connected to the drains of n-channel MOS transistors 9 and 10, respectively.

P-channel MOS transistor 7 has its gate connected to the gate of p-channel MOS transistor 8 and the drain of p-channel MOS transistor 7 and cooperates with transistor 8 to configure a current mirror circuit.

N-channel MOS transistor 9 has its gate connected to internal power supply node 2 to receive internal voltage VDL. N-channel MOS transistor 10 has its gate receiving reference voltage VREF. N-channel MOS transistors 9 and 10 have their sources grounded.

In the FIG. 3 differential amplification circuit 3 when a differential output from the current mirror differential amplifier is output to the output node or the transistor 10 drain it is shaped via inverters 11 and 12 and output as an shaped oscillation signal OSH on an output node of inverter 12.

Herein in the current mirror differential amplifier the transistor 10 gate can be increased to be larger in width than the transistor 9 gate so that a level in voltage higher than reference voltage VREF can be set as an oscillation detection level.

This is because when the transistor 10 gate is increased in width to be larger than the transistor 9 gate the differential amplifier provides a negatively unbalanced output for a differential input of zero and when this unbalanced output is converted to an offset voltage of the input terminal, setting a higher level in voltage than reference voltage VREF to be an oscillation detection level is equivalent to setting reference voltage VREF to be higher in potential by the offset voltage.

Note that the oscillation detection level is set to be higher in potential than reference voltage VREF because such prevents the oscillation detection circuit from erroneously detecting as an oscillation a slight variation introduced by noise or any other similar factors other than oscillation.

Thus in the FIG. 3 current mirror differential amplifier an internal voltage is compared with an oscillation detection level corresponding to a level of voltage higher than reference voltage 3.

Consequently, when internal voltage VDL is higher than the oscillation detection level the n-channel MOS transistor 10 drain has a potential attaining the high level and through inverters 11 and 12 shaped oscillation signal OSH having the high level is output.

In contrast, if internal voltage VDL is lower than the oscillation detection level, the transistor 10 drain has a potential attaining the low level and through inverters 11 and 12 shaped oscillation signal OSH having the low level is output.

Figure 4:
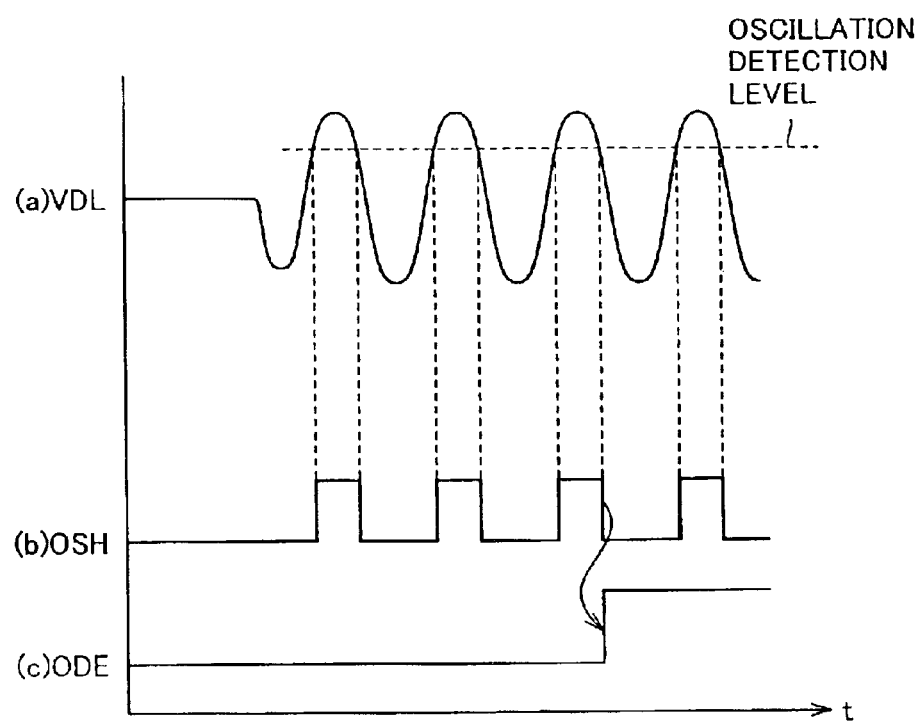
FIG. 4 represents waveforms of an internal voltage VDL (a), a shaped oscillation signal OSH (b) and an oscillation detection signal ODE (c), respectively, in the semiconductor integrated circuit of the first embodiment of the present invention.

FIG. 4 represents internal voltage VDL (a) received in the semiconductor integrated circuit of the first embodiment of the present invention, shaped oscillation signal OSH (b) output from differential amplification circuit 3 of FIG. 2, and oscillation detection signal ODE (c) output from counter circuit 4 shown in FIG. 2, as represented in waveform.

Figure 10:
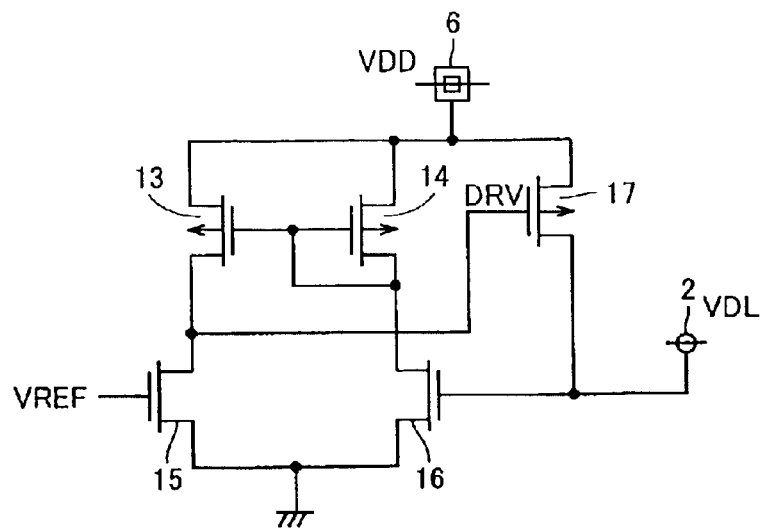
FIG. 10 is a circuit diagram specifically showing one example of a conventional, internal power supply voltage down conversion circuit.
Figure 11:
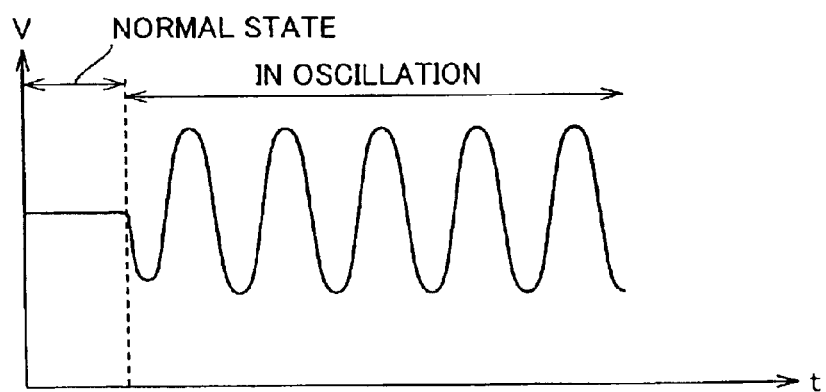
FIG. 11 represents a waveform of internal voltage VDL in the conventional, internal power supply voltage down conversion circuit.

As shown in FIG. 4 at (a) internal voltage VDL in a normal state is maintained at reference voltage VREF and when power supply node 2 of FIG. 10 is supplied with an excessive current internal voltage VDL varies significantly relative to reference voltage VREF or oscillates.

In differential amplification circuit 3 of FIG. 2 when internal voltage VDL represented in FIG. 4 at (a) is input it is compared with an oscillation detection level set to be higher in potential than the reference voltage VREF level.

If internal voltage VDL is higher than the oscillation detection level the current mirror differential amplifier of FIG. 3 outputs the high level and through inverters 11 and 12 of FIG. 3 shaped oscillation signal OSH having the high level is output, as represented in FIG. 4 at (b).

If internal voltage VDL is lower than the oscillation detection level the current mirror differential amplifier outputs the low level and through inverters 11 and 12 shaped oscillation signal OSH having the low level is output.

Shaped oscillation signal OSH shown in FIG. 4 at (b) is then input to counter circuit 4 of FIG. 2. Counter circuit 4 counts how many times signal OSH attains the high level. When counter circuit 4 confirms that the signal has attained the high level a predetermined number of times (for example three times in FIG. 4), counter circuit 4 determines that internal voltage VDL is oscillating and counter circuit 4 outputs oscillation detection signal ODE having the high level, as represented in FIG. 4 at (c).

If counter circuit 4 does not confirm that signal OSH attains the high level the predetermined number of times within a predetermined period then by counter reset signal RST input through delay stage 5 of FIG. 2 counter circuit 4 is reset and returns to the initial state.

Thus the present invention in the first embodiment provides a semiconductor integrated circuit with an oscillation detection circuit constantly comparing an internal voltage level with an oscillation detection level set to be higher in potential than a reference voltage and when the internal voltage level has exceeded the oscillation detection level a predetermined number of times within a predetermined period an oscillation detection signal can be output to allow more ensured oscillation detection than when for example a tester is used to monitor the internal voltage.

Second Embodiment

Figure 5:
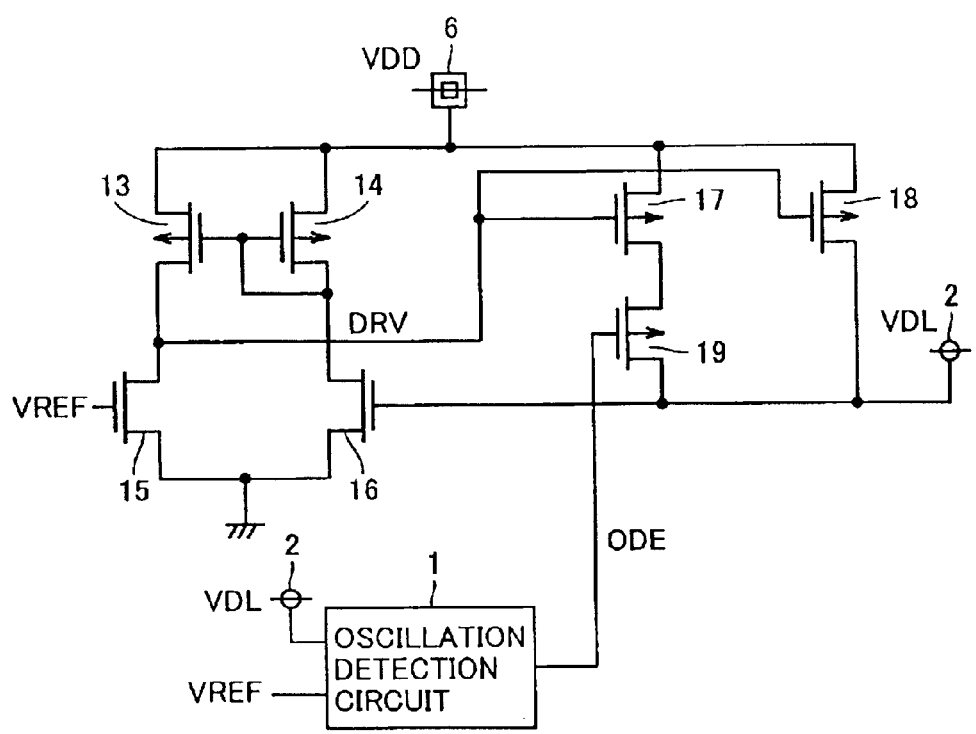
FIG. 5 is a circuit diagram specifically showing an internal power supply voltage down conversion circuit in a semiconductor integrated circuit of a second embodiment of the present invention.

FIG. 5 is a circuit diagram specifically showing an internal power supply voltage down conversion circuit in the semiconductor integrated circuit of the present invention in a second embodiment.

With reference to FIG. 5, the internal power supply voltage down conversion circuit includes a comparator detecting a difference in potential between reference voltage VREF and internal voltage VDL and providing a result of the comparison, and a feedback loop driven by the result to control drive transistors 17 and 18 formed of p-channel MOS transistors.

The internal power supply voltage down conversion circuit of the second embodiment shown in FIG. 5 differs from the FIG. 10 conventional internal power supply voltage down conversion circuit in that drive transistor 17 is replaced by two drive transistors 17 and 18 connected in parallel to external power supply node 6 and that a p-channel MOS transistor 19 is further connected between the drain of drive transistor 17 and internal power supply node 2. Their like components will not be described.

Drive transistor 17 has its source connected to external power supply node 6 and its drain to the source of p-channel MOS transistor 19. Drive transistor 18 has its source connected to external power supply node 6 and its drain to internal power supply node 2.

Furthermore, drive transistors 17 and 18 have their gates connected to a comparator circuit's output node or the n-channel MOS transistor 15 drain and both receiving a power supply drive signal DRV.

P-channel MOS transistor 19 has its gate connected to an output node of oscillation detection circuit 1 to receive oscillation detection signal ODE. P-channel MOS transistor 19, responding to oscillation detection signal ODE by electrically coupling the drain of drive transistor 17 with internal power supply node 2, functions as a drive size adjustment transistor adjusting an amount of a current supplied from drive transistor 17 to internal power supply node 2.

In the FIG. 5 internal power supply voltage down conversion circuit when drive transistors 17 and 18 receive power supply drive signal DRV at their gates a current is supplied from each of the transistors to internal power supply node 2 to eliminate variation in internal voltage VDL.

If internal voltage VDL oscillates, oscillation detection circuit 1 detects the oscillation and outputs oscillation detection signal ODE having the high level and p-channel MOS transistor 19 receives signal ODE at its gate, the gate's potential attains the high level and p-channel MOS transistor 19 is turned off.

This interrupts a current supplied from drive transistor 17 to internal power supply node 2 and only drive transistor 18 supplies a current.

Consequently, the internal power supply voltage down conversion circuit can have a reduced current supplying ability and thus eliminate an oscillation of internal voltage VDL that is introduced by an excessively supplied current.

Thus in accordance with the present invention in the second embodiment an oscillation detection signal fed back to the internal power supply voltage down conversion circuit can be used to reduce the conversion circuit's current supplying ability to spontaneously eliminate oscillation from the conversion circuit.

Third Embodiment

Figure 6:
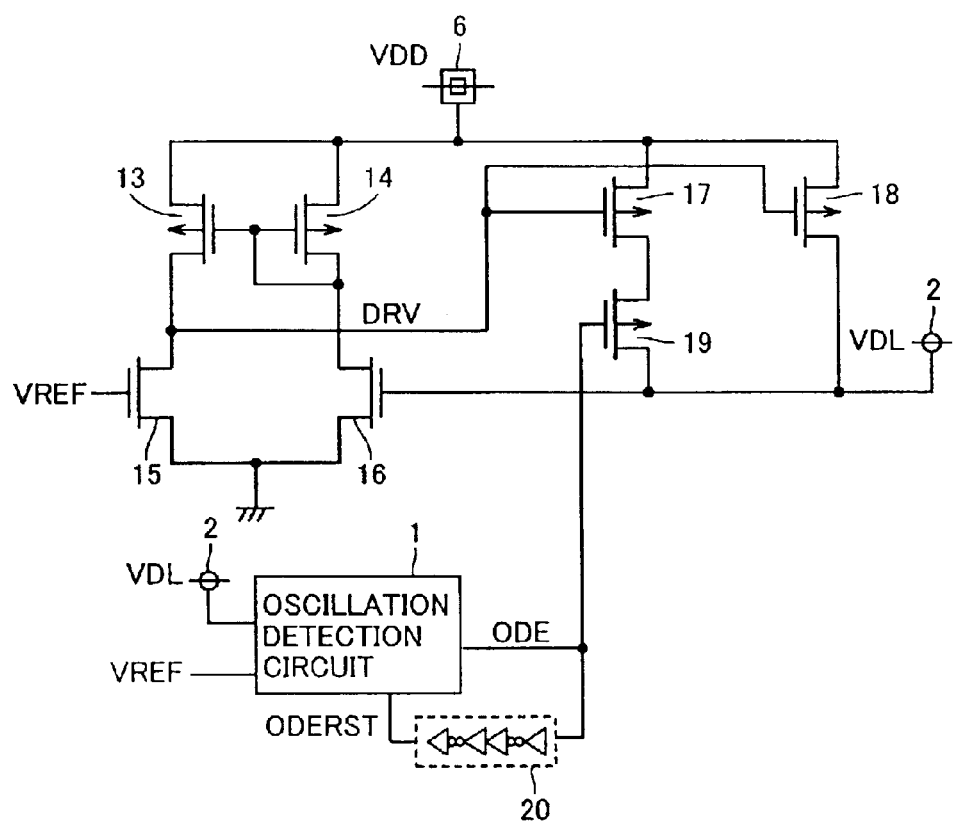
FIG. 6 is a circuit diagram specifically showing an internal power supply voltage down conversion circuit in a semiconductor integrated circuit of a third embodiment of the present invention.

FIG. 6 is a circuit diagram for illustrating a configuration of an internal power supply voltage down conversion circuit in the semiconductor integrated circuit of the present invention in a third embodiment.

The FIG. 6 circuit differs from the FIG. 5 circuit of the second embodiment in that oscillation detection circuit 1 has an output node provided with a delay stage 20. Their like components will not be described.

With reference to FIG. 6, delay stage 20 is formed of a plurality of inverters connected in series. Delay stage 20 receives oscillation detection signal ODE output from oscillation detection circuit 1, delays signal ODE for a predetermined period of time, and feeds the delayed signal as an oscillation detection signal reset signal ODERST back to oscillation detection circuit 1.

Thus oscillation detection signal ODE output from oscillation detection circuit 1 that has the high level is inactivated by oscillation detection signal reset signal ODERST input after a predetermined period of time predetermined by delay stage 20 and thus attains the low level.

As such, after oscillation detection signal ODE of the high level is input when a predetermined period of time elapses p-channel MOS transistor 19 receives oscillation detection signal ODE of the low level at its gate. In response, p-channel MOS transistor 19 has a gate potential transitioning from the high to low levels and thus transitions from an off state to an on state.

Consequently, drive transistor 17 is electrically coupled with internal power supply node 2 to resume supplying node 2 with a current.

In other words, when oscillation is detected the FIG. 6 internal power supply voltage down conversion circuit can operate to provide a reduced current supplying ability and thus eliminate oscillation of internal voltage VDL. However, maintaining the reduced current supplying ability would reduce internal voltage VDL in level. Accordingly, after a predetermined period of time has elapsed the reduced current supplying ability can be increased to hold internal voltage VDL at the reference voltage VREF level.

Note that by adjusting the number of inverters configuring delay state 26 of FIG. 6, the predetermined period of time is set to be sufficiently longer than the period that starts when the current supplying ability is reduced and that ends when the internal voltage VDL oscillation is eliminated. This is done to consider that increasing a decreased current supplying ability after oscillation is detected when a short period of time has elapsed may result in internal voltage VDL again oscillating.

Figure 7:
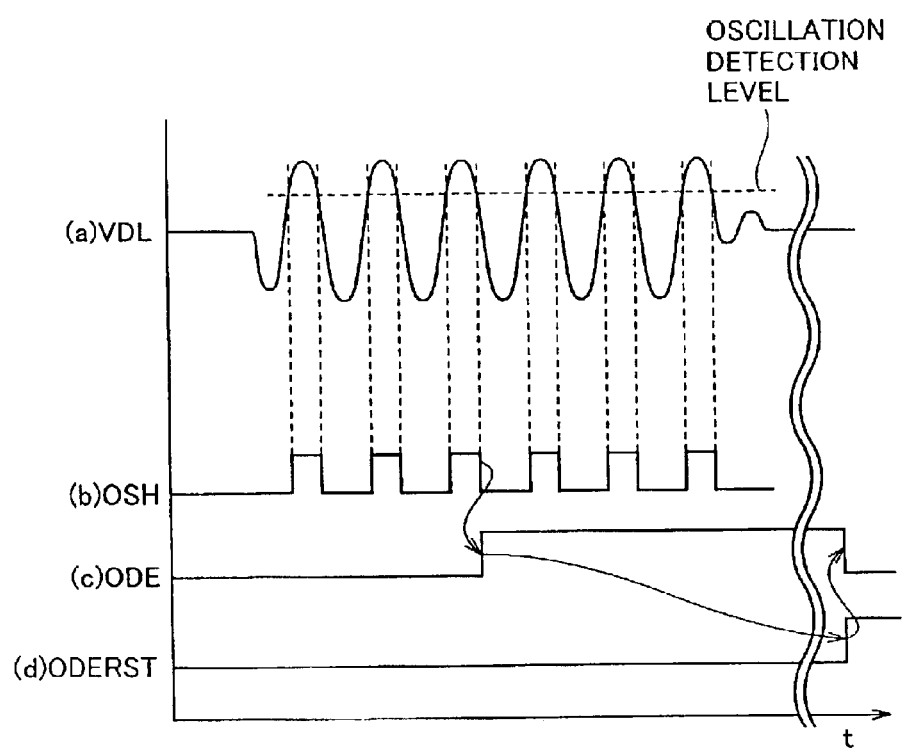
FIG. 7 represents waveforms of an internal voltage VDL (a), a shaped oscillation signal OSH (b), an oscillation detection signal ODE (c), and an oscillation detection signal reset signal ODERST (d), respectively, in the semiconductor integrated circuit of the third embodiment of the present invention.

FIG. 7 represents internal voltage VDL (a), shaped oscillation signal OSH (b) based thereon, oscillation detection signal ODE (c) and oscillation detection signal reset signal ODERST (d) generated by delaying oscillation detection signal ODE in the internal power supply voltage down conversion circuit of the semiconductor integrated circuit of the present invention in the third embodiment, as represented in waveform.

With reference to FIG. 7, when shaped oscillation signal OSH (b), which is output from differential amplification circuit 3 of FIG. 2 receiving internal voltage VDL (a), attains the high level a predetermined number of times (three times in FIG. 7), as counted by counter circuit 4, a decision is made that the internal voltage is in oscillation and oscillation detection signal ODE (c) having the high level is output.

In the FIG. 6 internal power supply voltage down conversion circuit when p-channel MOS transistor 19 receives oscillation detection signal ODE of the high level at its gate transistor 19 turns off to interrupt a current supplied from drive transistor 17 to internal power supply node 2. This results in a reduced current supplying ability and eliminates oscillation of internal voltage VDL.

Furthermore, oscillation detection signal ODE is input as oscillation detection signal reset signal ODERST to oscillation detection circuit 1 via delay stage 20 of FIG. 6 after oscillation is detected when a sufficiently long period of time has elapsed, as shown in FIG. 7 at (d).

Oscillation detection signal ODE shown in FIG. 7 at (c) is inactivated by oscillation detection signal reset signal ODERST and attains the low level. When p-channel MOS transistor 19 of FIG. 6 receives oscillation detection signal ODE of the low level transistor 19 turns on to resume supplying a current from drive transistor 17 to internal power supply node 2. The internal power supply voltage down conversion circuit can have its current supplying ability recovered to maintain internal voltage VDL again at the reference voltage VREF level.

Thus, in the third embodiment, in the internal power supply voltage down conversion circuit an oscillation detection signal fed back from an oscillation detection circuit can be used to provide a reduced current supplying ability to spontaneously eliminate an oscillation and furthermore after a predetermined period of time has elapsed the oscillation detection signal can be inactivated to increase the reduced current supplying ability to prevent the internal voltage from dropping in level.

Fourth Embodiment

Figure 8:
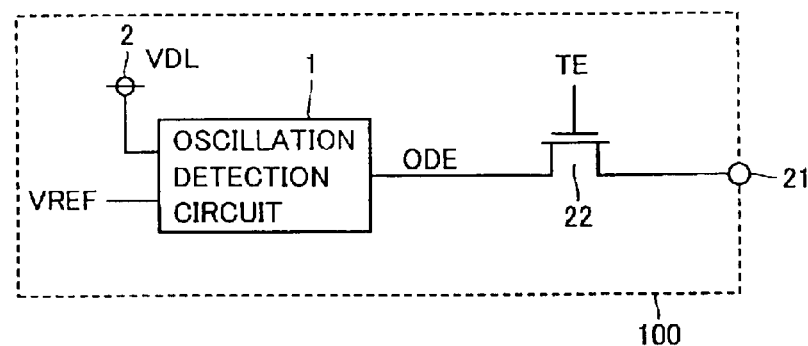
FIG. 8 is a circuit diagram for illustrating a portion extracted from a semiconductor integrated circuit of a fourth embodiment of the present invention that is involved in oscillation detection.

FIG. 8 is a circuit diagram for illustrating a portion extracted from the semiconductor integrated circuit of the present invention in a fourth embodiment that is involved in oscillation detection.

With reference to FIG. 8, oscillation detection circuit 1 has an output node connected to the drain of an n-channel MOS transistor 22 serving as a test mode circuit.

N-channel MOS transistor 22 has its drain receiving oscillation detection signal ODE, its gate receiving a test mode signal TE, and its source connected to an external output node 21.

In this configuration, a semiconductor integrated circuit 100 is caused to previously enter a test mode of operation and test mode signal TE having the high level is input. N-channel MOS transistor 22 turns on.

In this state when transistor 22 receives oscillation detection signal ODE from oscillation detection circuit 1 the transistor outputs signal ODE through its source to external output node 21.

As such, by monitoring external output node 21, it can be observed whether internal voltage VDL is oscillating.

Thus in the fourth embodiment in a test mode of operation an oscillation detection signal can be monitored at an external output node to allow more ensured oscillation detection than when an internal voltage's level is directly monitored.

Fifth Embodiment

Figure 9:
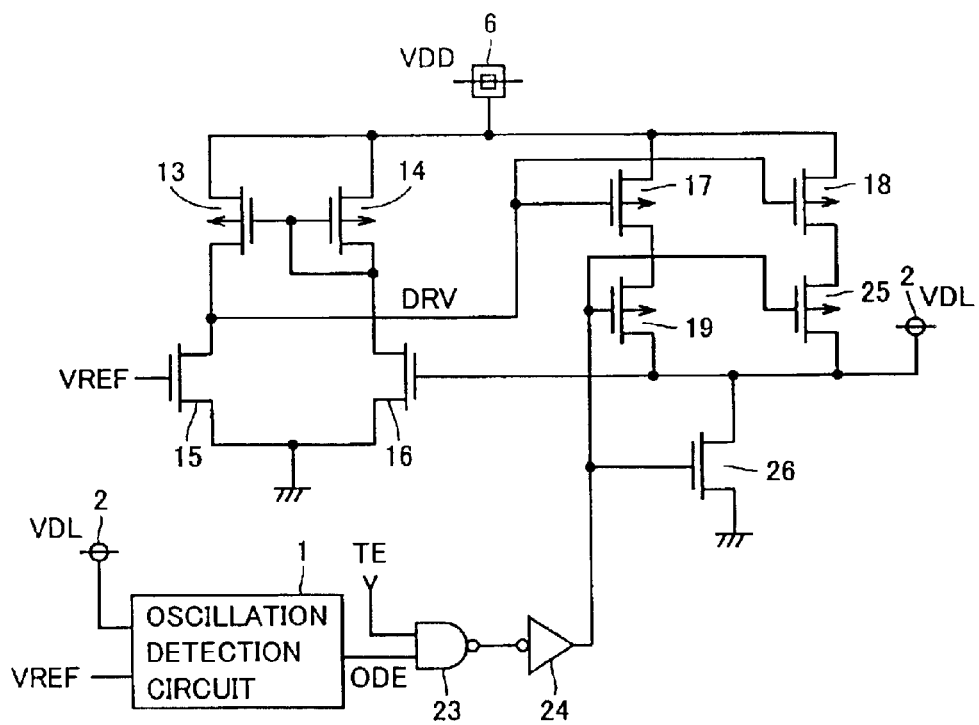
FIG. 9 is a circuit diagram specifically showing an internal power supply voltage down conversion circuit in a semiconductor integrated circuit of a fifth embodiment of the present invention.

FIG. 9 is a circuit diagram for illustrating a configuration of an internal power supply voltage down conversion circuit of the semiconductor integrated circuit in accordance with the present invention in a fifth embodiment.

As shown in FIG. 9, the internal power supply voltage down conversion circuit of the fifth embodiment differs from the conventional, internal power supply voltage down conversion circuit of FIG. 10 in that the former includes drive transistors 17 and 18 having their sources connected to external power supply node 6, p-channel MOS transistors 19 and 25 connected between the drains of drive transistors 17 and 18 and internal power supply node 2, an n-channel MOS transistor 26 connected between internal power supply node 2 and a ground level, and a 2-input NAND circuit 23 and an inverter 24. Their like components will not be described.

2-input NAND circuit 23 has a first input node connected to an output node of oscillation detection circuit 1 and a second input node connected to an output node of test mode signal TE (not shown). 2-input NAND circuit 23 has an output node connected to an input node of inverter 24.

Inverter 24 has an output node connected to p-channel MOS transistors 19 and 25 and n-channel MOS transistor 26 at their respective gates.

N-channel MOS transistor 26 has its drain connected to internal power supply node 2 and also to the drains of p-channel MOS transistors 19 and 25, and its source connected to a ground level.

In the above configuration when 2-input NAND circuit 23 receives oscillation detection signal ODE and test mode signal TE at its first and second input nodes, respectively, it outputs a signal to the input node of inverter 24.

By inputting test mode signal TE of the high level to 2-input NAND circuit 23 at the first input node, oscillation detection signal ODE having the high level is inverted in logic by 2-input NAND circuit 23 and output as a signal having the low level. The signal is further inverted by inverter 24 and it is received as oscillation detection signal ODE having the high level by p-channel MOS transistors 19 and 25 and n-channel MOS transistor 26 at their gates.

When p-channel MOS transistors 19 and 25 receive oscillation detection signal ODE of the high level, their gates' potential attains the high level and the transistors turn off to interrupt currents supplied from drive transistors 17 and 18 to internal power supply node 2.

Furthermore, when n-channel MOS transistor 26 receives oscillation detection signal ODE of the high level, its gate potential attains the high level and the transistor turns on.

As a result, internal power supply node 2 and a ground level are short-circuited. Semiconductor integrated circuit 100 does not operate normally and without monitoring any node it can be confirmed that internal voltage VDL is oscillating.

Thus in the fifth embodiment in a test mode of operation an oscillation detection signal fed back to an internal power supply voltage down conversion circuit can be used to prevent a normal operation of a semiconductor integrated circuit to eliminate the necessity of monitoring any node to confirm an oscillation of an internal power supply.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit operating receiving at an internal circuit an internal voltage from an internal power supply node, said internal voltage being lower than an external power supply voltage, comprising:

an internal power supply voltage down conversion circuit for generating said internal voltage at said internal power supply node, said internal voltage being the external power supply voltage decreased to a reference voltage corresponding to a targeted level; and an oscillation detection circuit for outputting an oscillation detection signal when a variation of no less than a predetermined variation is observed in said internal voltage relative to said reference voltage a predetermined number of times within a predetermined period of time, said oscillation detection circuit including a counter circuit for counting a frequency of said variation of no less than said predetermined variation.

2. The semiconductor integrated circuit according to claim 1, wherein:

said oscillation detection circuit has an oscillation detection level corresponding to a potential of said reference voltage plus said predetermined variation;

said oscillation detection circuit further includes:

a comparison circuit for comparing said internal voltage with said oscillation detection level and outputting a signal corresponding to a result of said comparing, and an oscillation shaping circuit for shaping said signal into a shaped oscillation signal having a first logical level for a difference in potential between said internal voltage and said oscillation detection level larger than said predetermined variation and a second logical level corresponding to an inverted version of said first logical level for a difference in potential between said internal voltage and said oscillation detection level smaller than said predetermined variation; and said counter circuit operates in response to said shaped oscillation signal being input to count how many times said shaped oscillation signal attains said first logical level, and outputs said oscillation detection signal when a count value reaches said predetermined number of times within said predetermined period of time.

3. The semiconductor integrated circuit according to claim 2, wherein:

said oscillation detection circuit further includes a delay stage for delaying said shaped oscillation signal for said predetermined period of time and then inputting said shaped oscillation signal to said counter circuit as a reset signal; and when said counter circuit receives said shaped oscillation signal said counter circuit starts said counting and when said counter circuit receives said reset signal said counter circuit resets said counting.

4. The semiconductor integrated circuit according to claim 1, wherein when said internal power supply voltage down conversion circuit receives said oscillation detection signal from said oscillation detection circuit said internal power supply voltage down conversion circuit reduces an ability to supply a current to said internal power supply node.

5. The semiconductor integrated circuit according to claim 4, wherein said internal power supply voltage down conversion circuit includes:

a comparison circuit for comparing said internal voltage with said reference voltage and outputting a signal corresponding to a result of said comparing;

a drive transistor operative in response to said signal from said comparison circuit to supply said internal power supply node with a current to generate said internal voltage; and a first field effect transistor operative in response to said oscillation detection signal to electrically couple said drive transistor to said internal power supply node, wherein when said internal power supply voltage down conversion circuit receives said oscillation detection signal from said oscillation detection circuit said internal power supply voltage down conversion circuit turns off said first field effect transistor to interrupt a current supplied to said internal power supply node.

6. The semiconductor integrated circuit according to claim 5, wherein:

said oscillation detection circuit inactivates said shaped oscillation signal after said oscillation detection signal is output when a predetermined period of time elapses; and when said oscillation detection signal inactivated is received said internal power supply voltage down conversion circuit turns on said first field effect transistor to resume supplying a current to said internal power supply node.

7. The semiconductor integrated circuit according to claim 6, wherein:

said oscillation detection circuit further includes a delay stage delaying said oscillation detection signal for said predetermined period of time, as counted from when said oscillation detection signal is output, and feeding back said oscillation detection signal delayed; and said oscillation detection signal is inactivated when said oscillation detection circuit receives said oscillation detection signal fed back via said delay stage.

8. The semiconductor integrated circuit according to claim 1, further comprising a test mode circuit for receiving an oscillation detection signal from said oscillation detection circuit and outputting said oscillation detection signal to an external output node when said test mode circuit receives a test mode signal having a predetermined logical level.

9. The semiconductor integrated circuit according to claim 1, further comprising a test mode circuit for receiving an oscillation detection signal from said oscillation detection circuit and outputting said oscillation detection signal to said internal power supply voltage down conversion circuit when said test mode circuit receives a test mode signal having a predetermined logical level, wherein when said internal power supply voltage down conversion circuit receives said oscillation detection signal from said test mode circuit, said internal power supply voltage down conversion circuit short-circuits said internal power supply node and a ground potential.

10. The semiconductor integrated circuit according to claim 9, wherein said internal power supply voltage down conversion circuit includes:

a comparison circuit for comparing said internal voltage with said reference voltage and outputting a signal corresponding to a result of said comparing;

a drive transistor operative in response to said signal from said comparison circuit to supply said internal power supply node with a current to generate said internal voltage; and a first field effect transistor operative in response to said oscillation detection signal to electrically couple said drive transistor to said internal power supply node;

a second field effect transistor operative in response to said oscillation detection signal to electrically couple said internal power supply node with a ground node, wherein when said internal power supply voltage down conversion circuit receives said oscillation detection signal from said oscillation detection circuit said internal power supply voltage down conversion circuit turns off said first field effect transistor to interrupt a current supplied to said internal power supply node and turns on said second field effect transistor to electrically shorts said internal power supply node.

* * * * *